(12) United States Patent
Momtaz

(10) Patent No.: US 7,202,707 B2
(45) Date of Patent: Apr. 10, 2007

(54) HIGH FREQUENCY BINARY PHASE DETECTOR

(75) Inventor: Afshin Momtaz, Laguna Hills, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 10/776,074

(22) Filed: Feb. 11, 2004

(65) Prior Publication Data

US 2005/0134338 A1    Jun. 23, 2005

Related U.S. Application Data

(60) Provisional application No. 60/531,095, filed on Dec. 19, 2003.

(51) Int. Cl.
G01R 25/00 (2006.01)
(52) U.S. Cl. .............................................. 327/12; 327/3
(58) Field of Classification Search .............. 327/1–12, 327/147–150, 156–159, 161, 153
See application file for complete search history.

(56) References Cited

U.S. PATENT DOCUMENTS

| 4,330,759 | A   |   | 5/1982  | Anderson |         |
|-----------|-----|---|---------|----------|---------|
| 5,432,480 | A   | * | 7/1995  | Popescu  | 331/11  |
| 5,744,983 | A   | * | 4/1998  | Bazes    | 327/3   |
| 6,388,485 | B2  | * | 5/2002  | Kim      | 327/161 |
| 6,392,457 | B1  | * | 5/2002  | Ransijn  | 327/156 |
| 6,526,109 | B1  | * | 2/2003  | Chang et al. | 375/371 |
| 6,577,694 | B1  | * | 6/2003  | Meghelli | 375/373 |
| 6,741,507 | B2  | * | 5/2004  | Iwamoto  | 365/194 |
| 6,822,483 | B1  | * | 11/2004 | Fu et al. | 327/2  |

OTHER PUBLICATIONS

Communication from the European Patent Office dated May 2, 2005; European Search Report for Application No. 04026609.
Lee, T. H., et al. "*A 155-HZ Clock Recovery Delay—and Phase-Locked Loop*." IEEE Journal of Solid State Circuits, vol. 27., No. 12, Dec. 1, 1992, pp. 1736-1746.
Sari, H.,et al. "*Phase and Frequency Detectors for Clock Synchronization in High-Speed Optical Transmission Systems*." European Transactions On Telecommunications and Related Technologies, vol. 5, No. 5, Sep.-Oct. 1994, pp. 101-107.
Glasford, G. "*Digital Electronic Circuits* ." Chapter 8: Bistable Circuits, Theory, Design, and Applications, pp. 358-361, Prentice Hall, New Jersey, 1987.

* cited by examiner

*Primary Examiner*—Timothy P. Callahan
*Assistant Examiner*—Cassandra Cox

(57) ABSTRACT

A phase detector includes a first flip flop having a data input coupled to a first clock signal at a first frequency and a clock input coupled to a second clock signal at a second frequency. The frequency of the first clock signal is a multiple of the frequency of the second clock signal. The phase detector also includes a second flip flop having a data input coupled to an output of the first flip flop and a clock input coupled to the second clock signal.

31 Claims, 11 Drawing Sheets

HIGH FREQUENCY BINARY PHASE DETECTOR

CROSS-REFERENCE TO RELATED APPLICATION(S)

This application claims the benefit of U.S. Provisional Patent Application Ser. No. 60/531,095, entitled "HIGH FREQUENCY BINARY PHASE DETECTOR FOR DELAY LOCK LOOP APPLICATIONS", filed Dec. 19, 2003, the disclosure of which is incorporated herein by reference.

BACKGROUND

Many high speed serial communication systems only transmit data over the communication media. In other words, these systems do not transmit clock signals that may be used by a receiver to recover data from the data stream in the signal received via the communication media. Consequently, receivers for high speed serial communication systems typically include clock and data recovery circuits that produce a clock signal synchronized with the incoming data stream that is then used to recover the data from the data stream. Data is typically recovered by generating a clock signal at a frequency that matches the frequency of the data stream. The clock is then used to sample or recover the individual data bits from the incoming data stream.

Some conventional receivers utilize a clock and data recovery circuit and retimer to recover data from a received signal in the above described manner. Typically the received signal is amplified by one or more buffer stages and the clock and data recovery circuit generates an extracted clock signal that has a phase and/or frequency that is fixed relative to the phase and/or frequency of the data stream in the received amplified signal. Using this recovered clock, the retimer extracts the data from the received signal.

Typically, the system is designed so that the retimer extracts the data from approximately the middle of each data symbol in the data stream. The retimer may comprise, by way of example, an edge-triggered flip flop that latches the received signal on an edge (e.g., the falling edge) of the clock. In this case, the clock and data recovery circuit is designed to align the edges of the extracted clock (in this example the rising edge) with the transition edge of the received data stream.

A typical clock and data recovery circuit uses a phase lock loop (PLL) or delay lock loop (DLL) to align the transition edges of the extracted clock with the transition edges of the incoming data stream. FIG. 1 is a simplified block diagram of one embodiment of a DLL 100.

The DLL 100 includes a phase detector 120 that receives, by way of example, a clock signal 110 on a first input and a feedback output signal 150(a) of the delay lock loop on a second input. Typically, the phase detector 120 generates at least one phase error signal 120(a) that is representative of the phase relationship between the feedback output signal 150(a) and the clock signal 110.

For example, the phase detector 120 may compare transitions in the clock 110 to the rising edges or the falling edges of the feedback output signal 150(a). The phase detector 120 then produces, by way of example, a phase error signal 120(a) that indicates whether the feedback output signal leads or lags the clock signal.

The phase error signal 120(a) drives a charge pump 130 that generates a current signal having a magnitude that varies in response to the phase error signal. A loop filter 140 then converts the current signal output by charge pump 130 to a voltage signal. This voltage signal drives a delay circuit (e.g., a variable delay line) 150 that is configured to delay a signal by an amount of time according to the magnitude of the applied voltage. In this way, the delay 150 may delay an input signal to generate an output signal 150(a) where the transition edges of the output signal 150(a) are aligned with the transition edges of the clock signal 110.

FIG. 2 illustrates an embodiment of a delay lock loop 200 that includes a phase detector 220, a digital filter 230 and a phase rotator 260. The phase detector 220 receives, by way of example, an incoming signal (e.g., a data signal) 210 on a first input and a feedback output signal 260(a) of the delay lock loop on a second input. Typically, the phase detector 220 generates at least one phase error signal 220(a) in accordance with the phase relationship between the feedback output signal 260(a) and the incoming data signal 210.

The phase error signal 220(a) drives a digital filter 230 that generates at least one digital control signal to control the phase rotation of a phase rotator 260. Thus, based on the digital control signal, the phase rotator 260 may shift the phase of a signal (e.g., a clock signal) 250 to generate an output signal 260(a) where the transition edges of the output signal 260(a) are aligned with the transition edges of the incoming data signal 210.

In some applications, the input signals of the phase detector will be of the same frequency. For these applications, the phase detector discussed above may consist of a phase and frequency detector (PFD). As illustrated in FIG. 3 one embodiment of a PFD 300 may include two flip flops 310(a–b) driven by first and second input signals 320 and 330, respectively, having the same frequency. In this embodiment AND gate 340 receives the output of each of the flip flops 310(a) and 310(b) and generates a common reset signal 370 for these flip flops.

When input signal 320 leads input signal 330 the up output signal 350 is high and the down output signal 360 is low. These phase error signals (when processed and fed to a delay component as discussed above for example) may, for example, cause a reduction in the delay imparted on the input signal 320. As a result, the transition edges of the delayed signal fed back to the input of the PFD will be more closely aligned with the transition edges of the other input signal 330.

When input signal 320 lags input signal 330 the up output signal 350 will be low and the down output signal 350 will be high. In this case, the delay imparted on the feedback signal (e.g., input 320) is increased to align the edges of the input signals 320 and 330.

For applications where the frequencies of the input signals to the phase detector are not equal, phase detection may be provided by, for example, a linear phase detector or a binary phase detector. In operation the output of a linear phase detector is proportional to the phase difference of its input signals.

The output of a binary phase detector on the other hand is one of two values (e.g., high or low), indicative of whether one signal leads or lags the other signal. Binary phase detectors do not, however, provide an indication of the magnitude of the phase difference between the signals.

FIG. 4 is a simplified block diagram of one embodiment of a binary phase detector 400 having three flip flips 410(a–c) each of which is driven by a first input signal 420 and a second input signal 430(a, b or c). Conventionally, the first input signal has a lower frequency than the second input signal of the phase detector. In the embodiment of FIG. 4 the second input signals 430(a–c) of the flips flops 410(a–c), respectively, are identical clock signals except that there is a 90 degree phase shift between successive signals. AND gates 440 and 450 compare the outputs of the flip flops 410(a–c) to generate an up signal (early) 460 and a down signal (late) 470, respectively, indicative of whether the first input signal 420 leads or lags the second input signal 430. The phase error signals 460 and 470 are then used to adjust the phase of an input signal, for example, as discussed above.

The flip flops 410(a–c) of the binary phase detector 400 operate at the speed of the frequency of the input clock signal 430 and are, therefore, the highest frequency components of the phase detector and the delay lock loop in this embodiment. Similarly, of the components in a conventional delay lock loop such as those illustrated in FIGS. 1 and 2, the phase detector typically operates at the highest frequency.

The input capacitance of a phase detector capable of operating at higher speeds typically presents a higher load to the input signal in comparison to a phase detector that operates at lower speeds. This additional load tends to adversely affect the performance and power consumption of the device.

To facilitate operation at high speeds, high speed CML flip flops implemented in CMOS logic for operation at or above 10 GHz may include inductive loads to tune out the parasitic capacitive loading on the inputs of the flip flop and to increase the bandwidth of the device. However, typical spiral inductors are relatively large devices that consume considerable die area. Thus, use of these inductors may increase the relative cost and size of the phase detector. In addition, high speed flip flops tend consume considerably more power than comparable devices operating at lower speeds.

In summary, a phase detector that operates at high speed may be difficult to design, may consume relatively large amounts of power, and may occupy a relatively large die area as compared to a phase detector that operates at lower speeds.

SUMMARY

The invention relates to a binary phase detector that generates at least one phase error signal representative of the relative phase between signals that are not of the same frequency. This phase error signal may then be used to phase align the signals.

In one aspect of the invention a phase detector includes a first flip flop having a data input coupled to a first clock signal at a first frequency and a clock input coupled to a second clock signal at a second frequency. The phase detector also includes a second flip flop having a data input coupled to an output of the first flip flop and a clock input coupled to the second clock signal. Here, the frequency of the second clock signal is less than the frequency of the first clock signal.

In one aspect of the invention a phase detector for delay lock loop applications includes a high speed flip flop and a low speed flip flop for generating at least one phase error signal that is used to delay a low speed signal to align transition edges of the low speed signal with transition edges of a high speed signal. The high speed signal drives the data input of the high speed flip flop and the low speed signal drives the clock of both flip flops.

In one aspect of the invention a phase detector includes a high speed flip flop that includes one high speed latch and one low speed latch.

In one aspect of the invention a phase detector is provided that is capable of operating at relatively high speeds and presents a relatively small load to a high speed input signal. In addition, in comparison to conventional high speed phase detectors, the disclosed phase detector may consume less power.

BRIEF DESCRIPTION OF THE DRAWINGS

These and other features, aspects and advantages of the present invention will be more fully understood when considered with respect to the following detailed description, appended claims and accompanying drawings, wherein:

Figure 1:
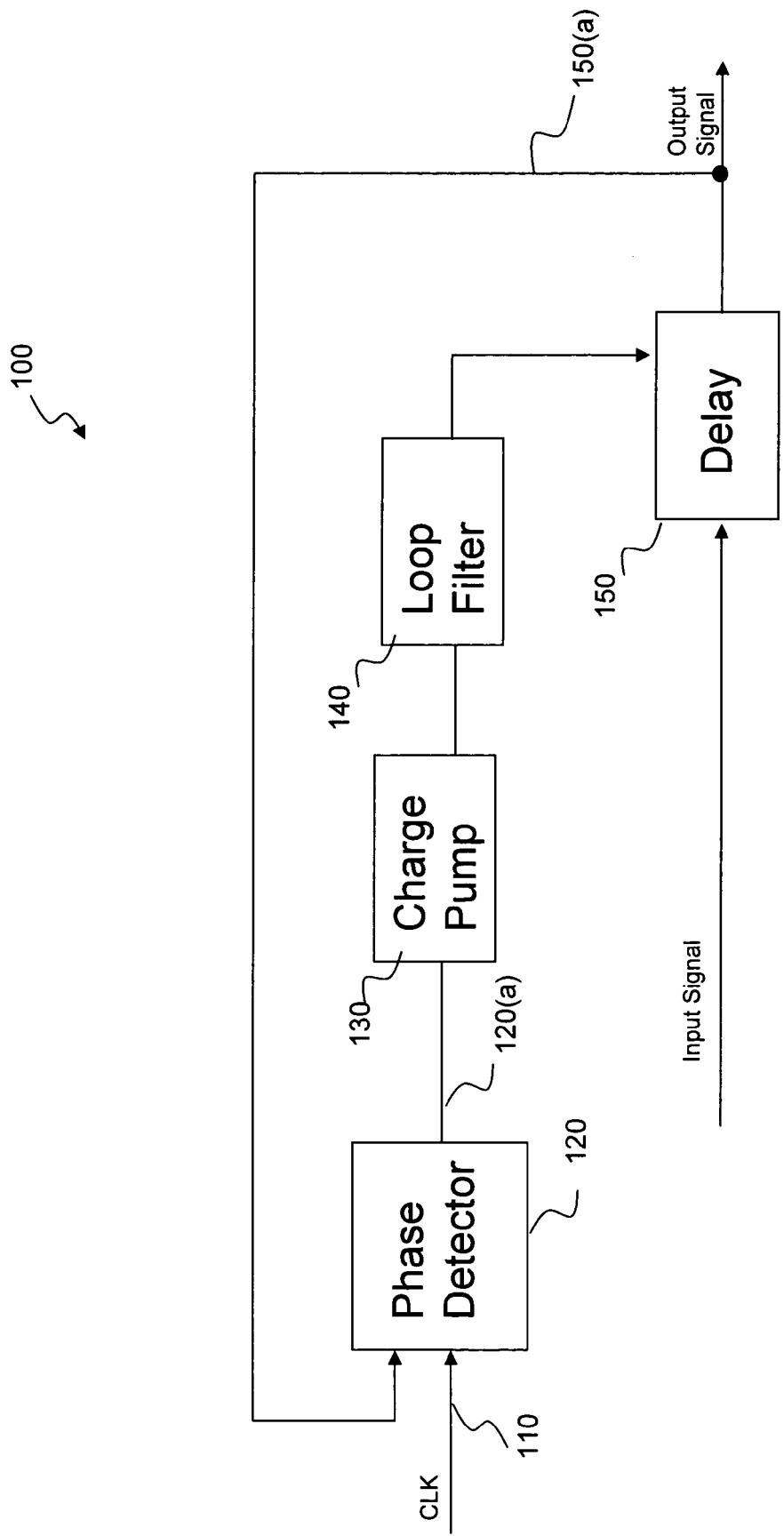
FIG. 1 is a simplified block diagram of one embodiment of a delay lock loop having a delay line.

In accordance with common practice the various features illustrated in the drawings are not to scale. On the contrary, the dimensions of the various features are arbitrarily expanded or reduced for clarity. In addition like reference numerals denote like features throughout the specification and figures.

DETAILED DESCRIPTION

The invention is described below, with reference to detailed illustrative embodiments. It will be apparent that the invention can be embodied in a wide variety of forms, some of which may be quite different from those of the disclosed embodiments. Consequently, the specific structural and functional details disclosed herein are merely representative and do not limit the scope of the invention.

Figure 2:
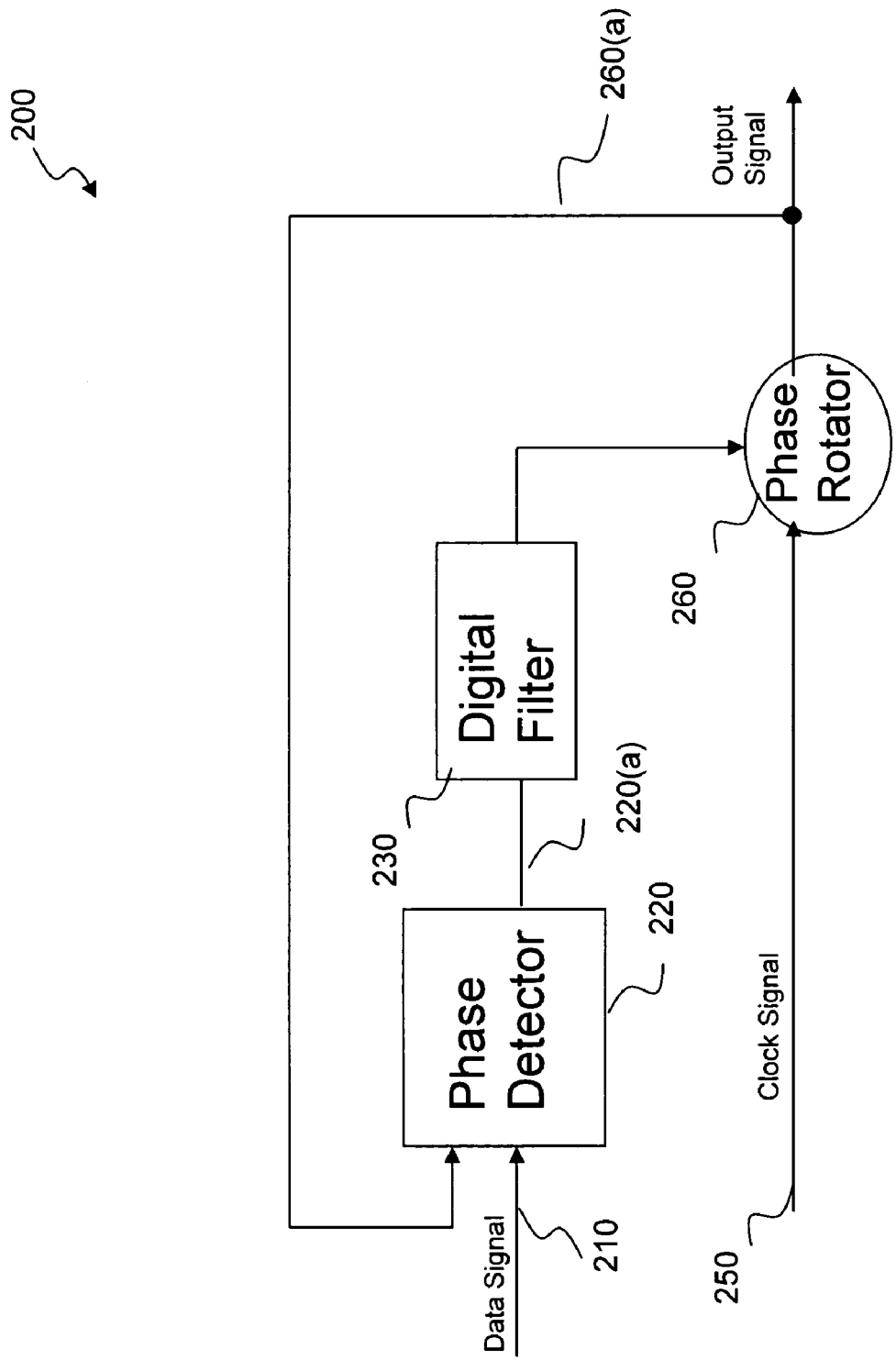
FIG. 2 is a simplified block diagram of one embodiment of a delay lock loop having a phase rotator.
Figure 3:
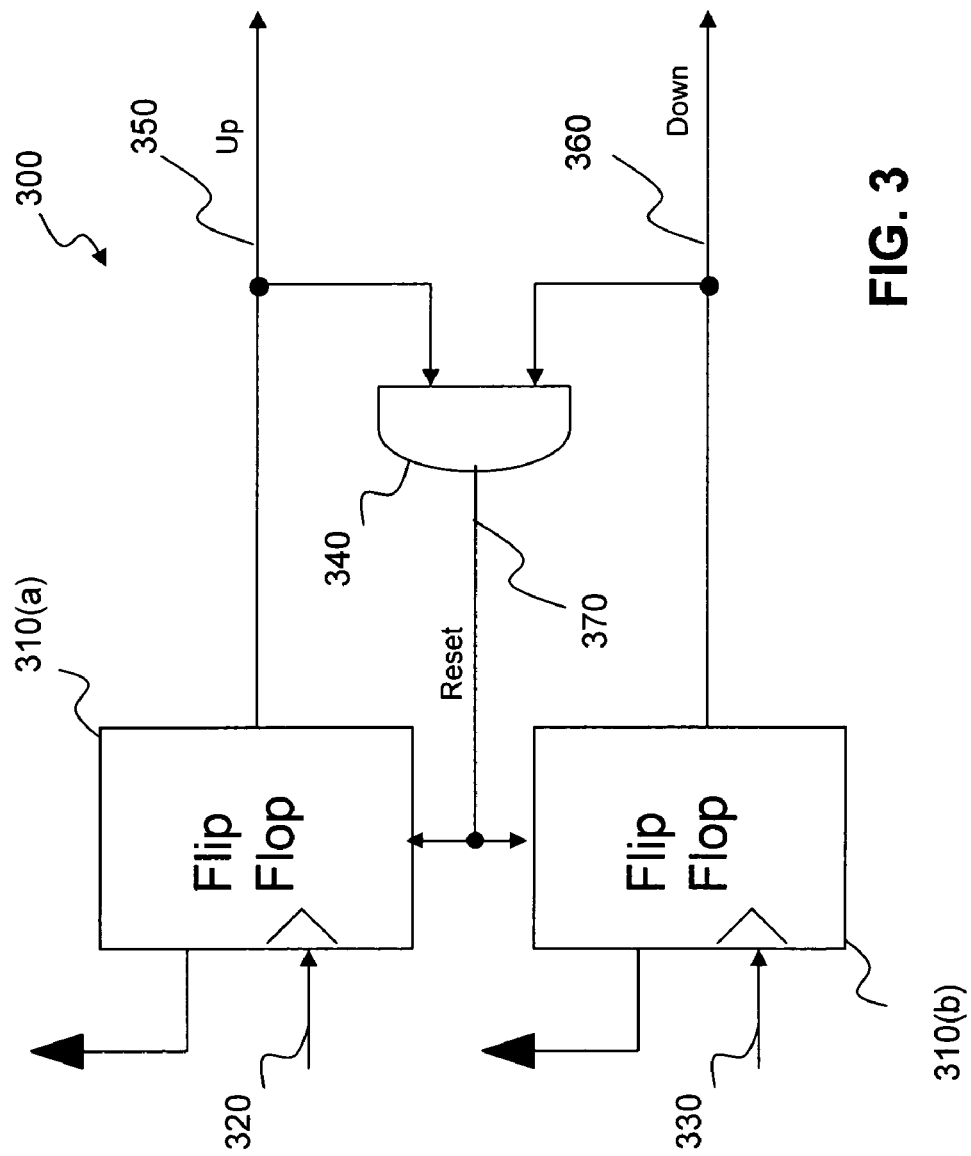
FIG. 3 is a simplified block diagram of one embodiment of a phase and frequency detector.

Some embodiments of the invention provide a high speed phase detector for a delay lock loop such as the delay lock loop illustrated in FIG. 2. In such an embodiment the phase detector may align the transitions edges of two input clocks having different frequencies. In practice, the teachings herein may be used to align periodic signals such as clock signals in a variety of components including, for example, delay lock loops and phase lock loops.

Figure 5:
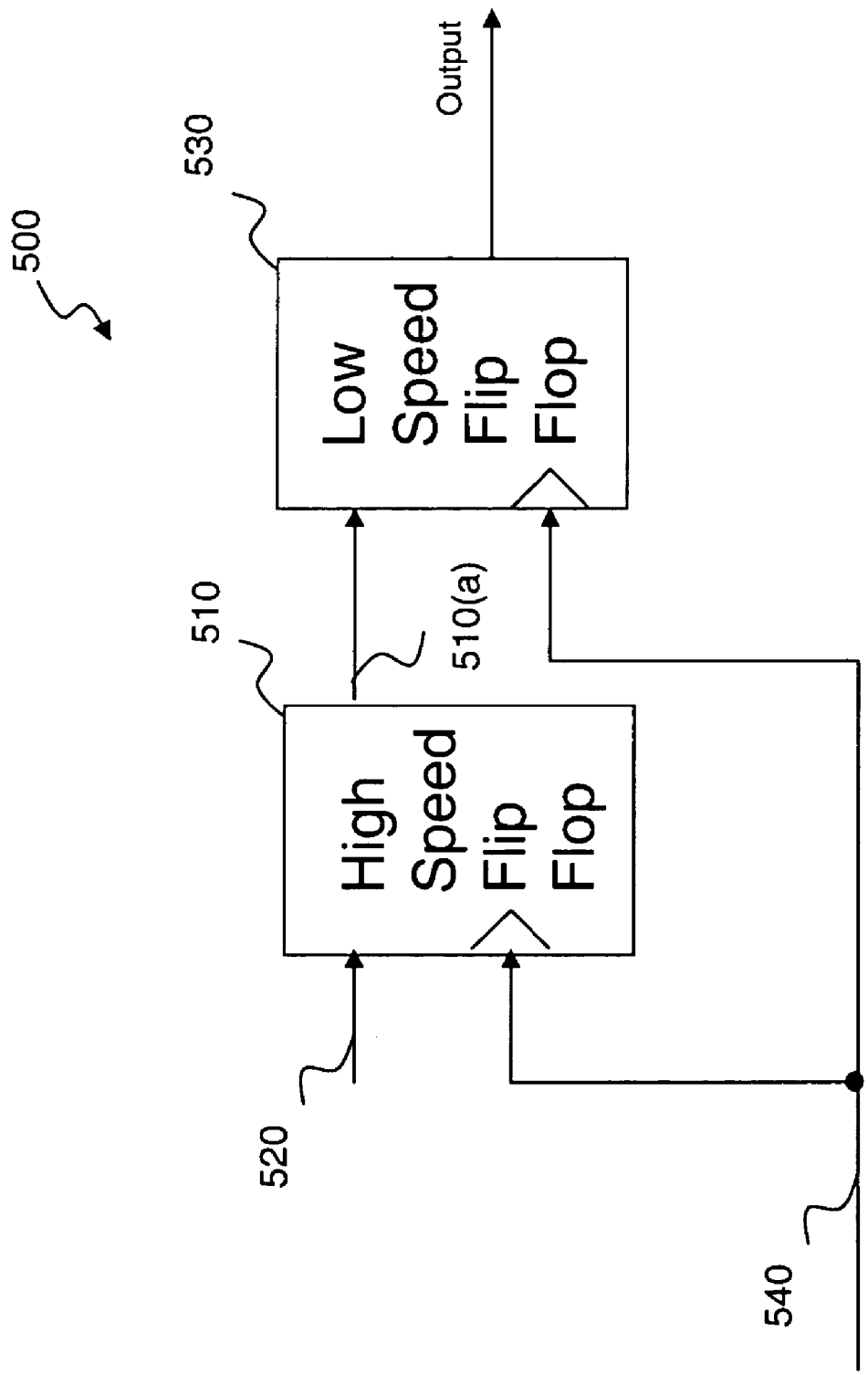
FIG. 5 is a simplified block diagram of a high speed phase detector in accordance with an exemplary embodiment of the present invention.

Referring to FIG. 5 in some embodiments a phase detector 500 comprises a high speed flip flop 510 and a low speed flip flop 530. The high speed flip flop 510 operates at the frequency of a high speed clock signal 520 which drives the data input of the high speed flip flop 510. In this embodiment, the output signal 510(a) of the high speed flip flop 510 drives the data input of the low speed flip flop 530. The low speed flip flop 530 typically operates at the frequency of a low speed clock signal 540 which drives the clock input of both flip flops 510 and 530. The second flip flop 530 may operate at a low speed in this circuit because the input data for the flip flop 530 has already been latched at the low speed by the first flip flop 510. The frequency of the high speed clock 540 is a multiple of the frequency of the low speed clock 520.

In one embodiment both flip flops 510 and 530 are, by way of example, rising edge D flip flops. One of skill in the art will appreciate that other types of flip flops may also be used.

Figure 6:
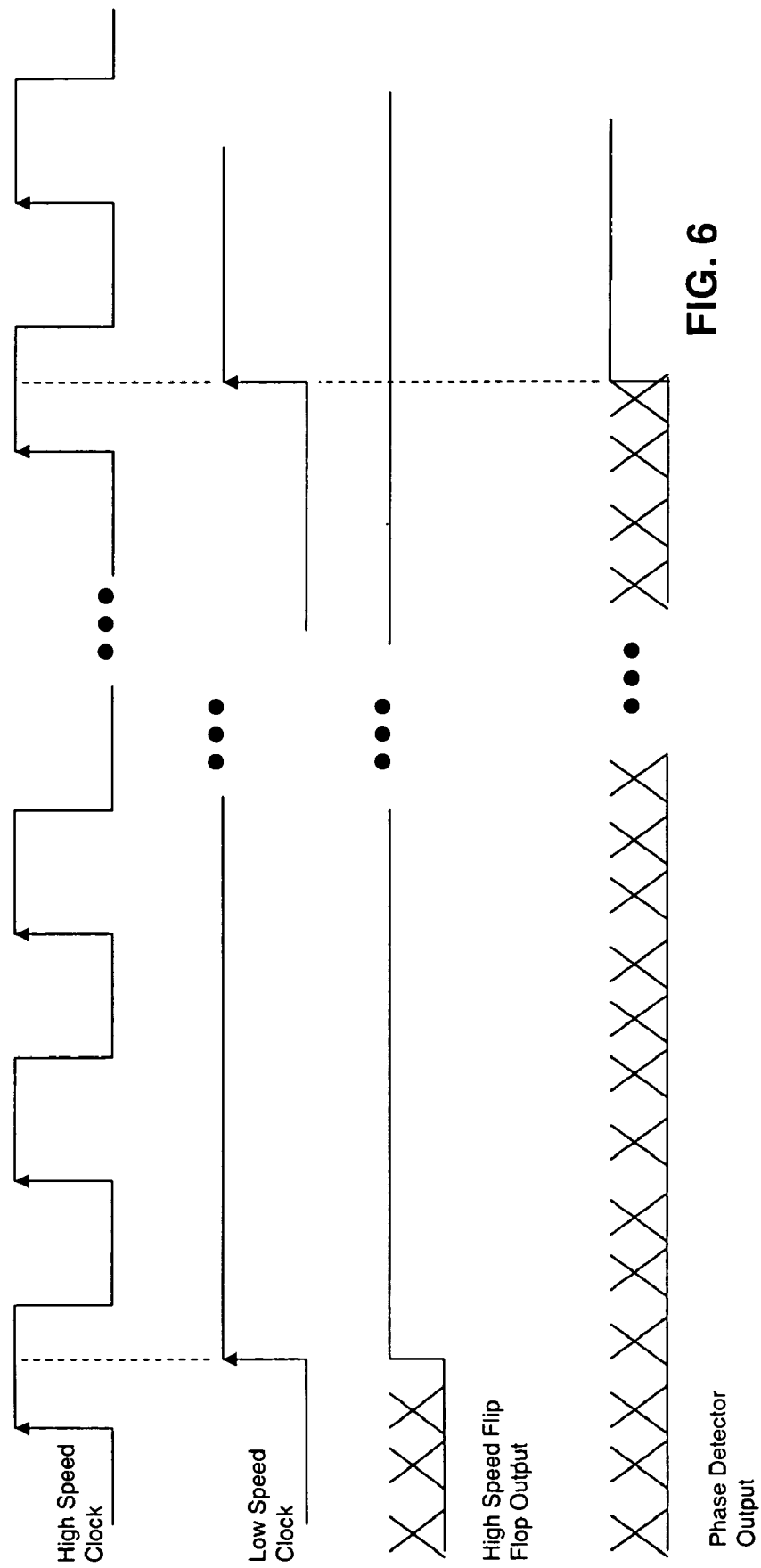
FIG. 6 is a timing diagram demonstrating an example of the operation of the phase detector of FIG. 5 when the low speed clock signal lags the high speed clock signal in accordance with an exemplary embodiment of the present invention.

FIG. 6 is an example of a simplified timing diagram of the operation of the phase detector 500 of FIG. 5 when the low speed clock 540 lags the high speed clock 520. In operation the high speed flip flop 510 latches the high speed clock signal 520 on the rising edge of the low speed clock signal 540. Thus, the output (line 510(a) in FIG. 5) of the high speed flip flop is high after the first low to high transition of the low speed clock in FIG. 6.

At the next rising edge of the low speed clock, the second flip flop 530 latches the output of the high speed flip flop 510 to ensure that the output of the phase detector is stable. In this instance the output of the phase detector is high thereby indicating that the low speed clock 540 lags the high speed clock 520.

Figure 7:
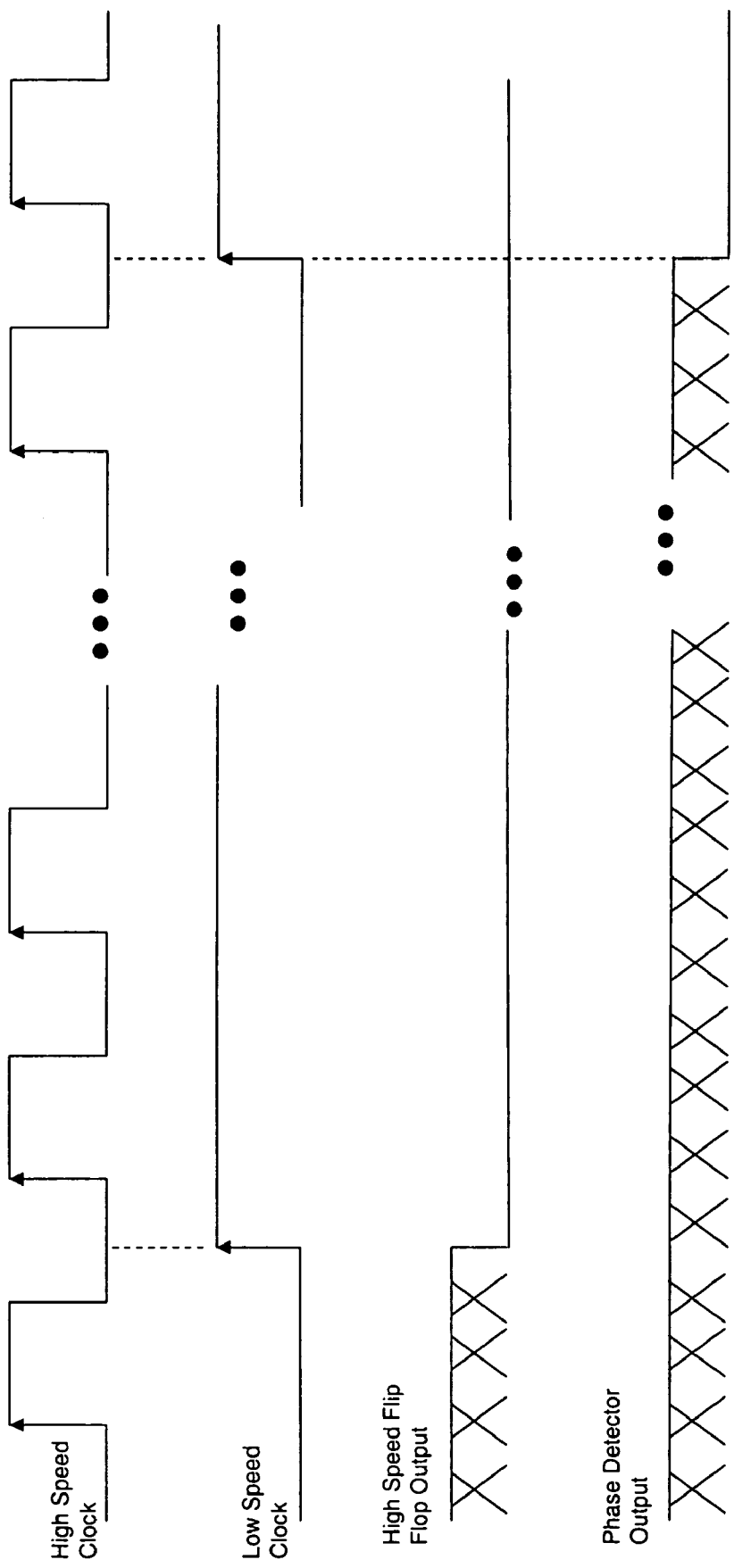
FIG. 7 is a timing diagram demonstrating an example of the operation of the phase detector of FIG. 5 when the low speed clock signal leads the high speed clock signal in accordance with an exemplary embodiment of the present invention.

FIG. 7 is an example of a simplified timing diagram of the operation of the phase detector 500 of FIG. 5 when the low speed clock 540 leads the high speed clock 520. In operation the high speed flip flop 510 again latches the high speed clock signal 520 on the rising edge of the low speed clock signal 540. In addition, the second flip flop 530 again latches the output of the high speed flip flop 510. In this instance the latched high speed clock signal is low and, as a result, the output of the phase detector is also low thereby indicating that the low speed clock 540 leads the high speed clock 520.

In one embodiment, the phase detector is used in a 10 Gigabit receiver. In this case the frequency of the high speed clock may be, for example, approximately 10 GHz and the frequency of the low speed clock may be, for example, approximately 155 MHz.

The phase detector of FIG. 5 may provide several of advantages over conventional phase detectors. For example, in general the clock input of a flip flop presents a larger capacitive load to an input signal as compared to the data input of the flip flop. Thus, as compared to a conventional design where the higher speed clock drives the clock input rather than the data input of a flip flop, the phase detector 500 of FIG. presents a lower capacitive load to the high speed clock 520.

In addition, the phase detector 500 may be implemented using fewer components as compared to a conventional phase detector that uses a higher speed clock to drive the data input rather than the clock input of a flip flop. Examples of phase detectors of this type include half-rate and quarter-rate phase detectors which typically require the use of two and four times more flip flops, respectively. Moreover, the use of more flip flops in these conventional designs increases the load capacitance on both the high speed and the low speed clock signals.

The use of the low speed flip flop 530 in the phase detector 500 further improves the performance of phase detector 500 as compared to conventional designs. A typical low speed flip flop presents a smaller capacitive load to an input signal as compared to a conventional high speed flip flop. Thus, by using a low speed flip flop rather than a high speed flip flop for the second flip flop, the phase detector 500 may present a lower capacitive load to the driving stage.

Advantageously the low speed flip flop 530 may consume, by way of example, an order of magnitude less power and may occupy less die area than the high speed flip flop 510. This may result in a lower cost phase detector 500 as compared to conventional phase detectors.

Figure 4:
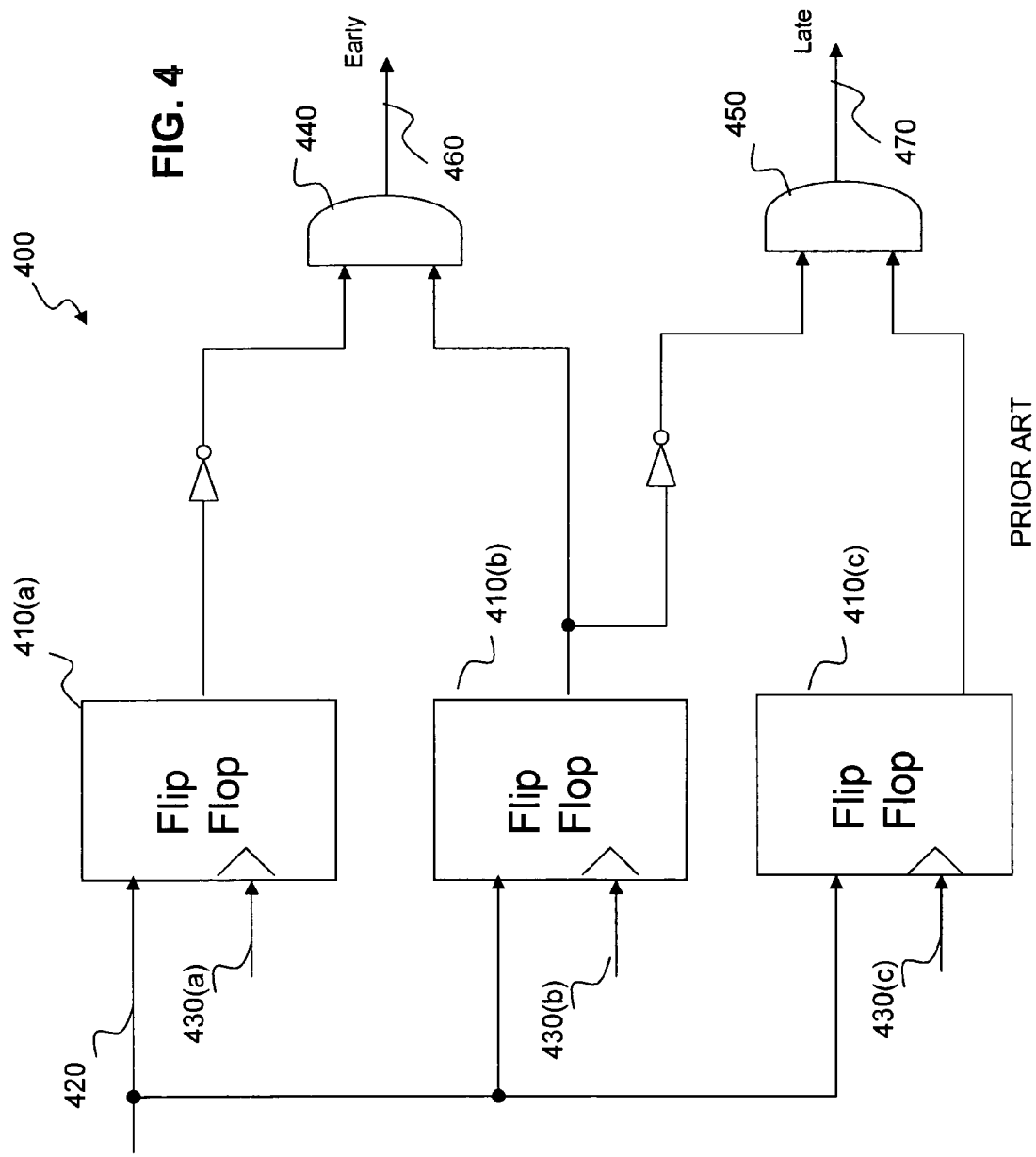
FIG. 4 is a simplified block diagram of one embodiment of a binary phase detector.

Moreover, as is known in the art, each of the flip flops may comprise for example, two latches which provide the track and hold functions that are required to latch the input data signal. In conventional designs all of the flip flop latches may be high speed latches. Advantageously, in the embodiment of FIG. 5 the second latch of the high speed flip flop 510 may be a low speed latch. Thus, for example, the circuit of FIG. 5 may be constructed using one high speed latch and three low speed latches. As discussed above, the use of low speed components may significantly improve the cost and performance of the device as compared to a conventional phase detector such as the one depicted in FIG. 4 that may incorporate six high speed latches.

In an application such as the delay lock loop of FIG. 2, a high speed signal may be used to drive a first input of the phase detector and a low speed signal may be used to drive the phase rotator 260. Thus, a phase detector constructed according to the embodiment of FIG. 5 may be used in this DLL to generate at least one phase error signal that indicates whether the low speed signal leads or lags the high speed signal. For example, a phase error signal may take the form of the signals depicted in FIGS. 6 and 7. This phase error signal may then drive the digital filter 230 that in turn generates a digital control signal that controls the phase rotator 260. In this way, the delay lock loop may rotate the phase of the low speed signal to bring the transitions edges of the low speed signal in alignment with the transition edges of the high speed signal.

Figure 8:
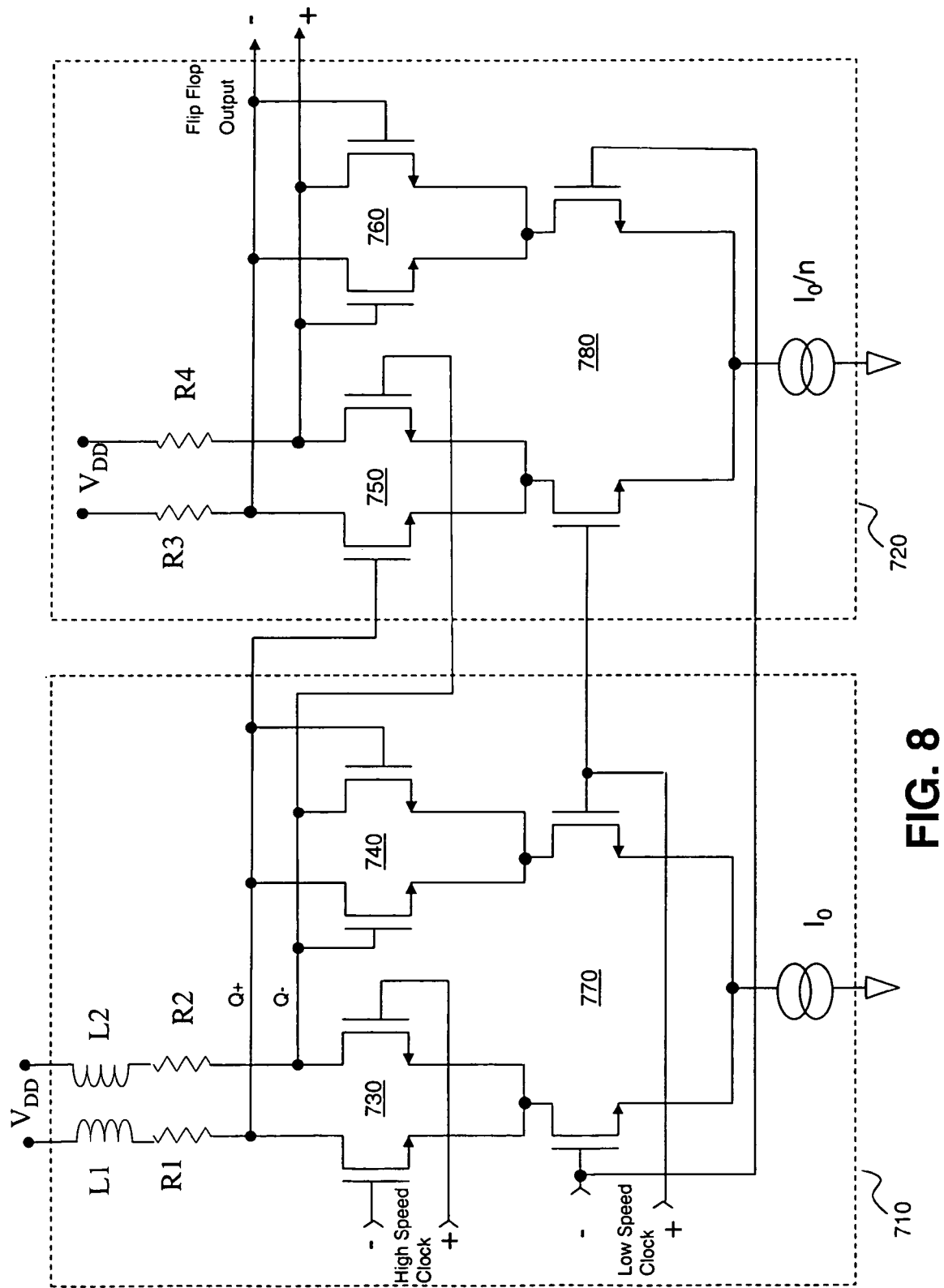
FIG. 8 is a simplified circuit diagram of one embodiment of a high speed flip flop for use in the phase detector of FIG. 5 in accordance with an exemplary embodiment of the present invention.

FIG. 8 is a simplified circuit diagram of one embodiment of the high speed flip flop 510 of FIG. 5. The flip flop 510 includes a first latch 710 and a second latch 720. In this embodiment a differential high speed clock signal drives the data inputs of a first differential pair of transistors 730 in the first latch 710. In this embodiment a low speed differential clock signal drives the clock differential transistor pairs 770 and 780 of latches 710 and 720, respectively. Thus, the first latch 710 is a high speed latch while the second latch 720 may be implemented using a low speed latch.

As shown in FIG. 8, the high speed latch 710 may incorporate inductive loads L1 and L2. As discussed above, these inductors may be used to tune out capacitive loading on the inputs of the flip flop. In some embodiments the high speed latch 710 may be designed in CML with a typical load capacitance on the order of 35 fF when operated at 10 GHz.

Since the latch 720 may operate at a lower speed, inductive loads may be eliminated in the latch 720, thereby reducing the size of the latch 720. Thus, the use of the low speed latch may provide significant cost and performance advantages.

Figure 9:
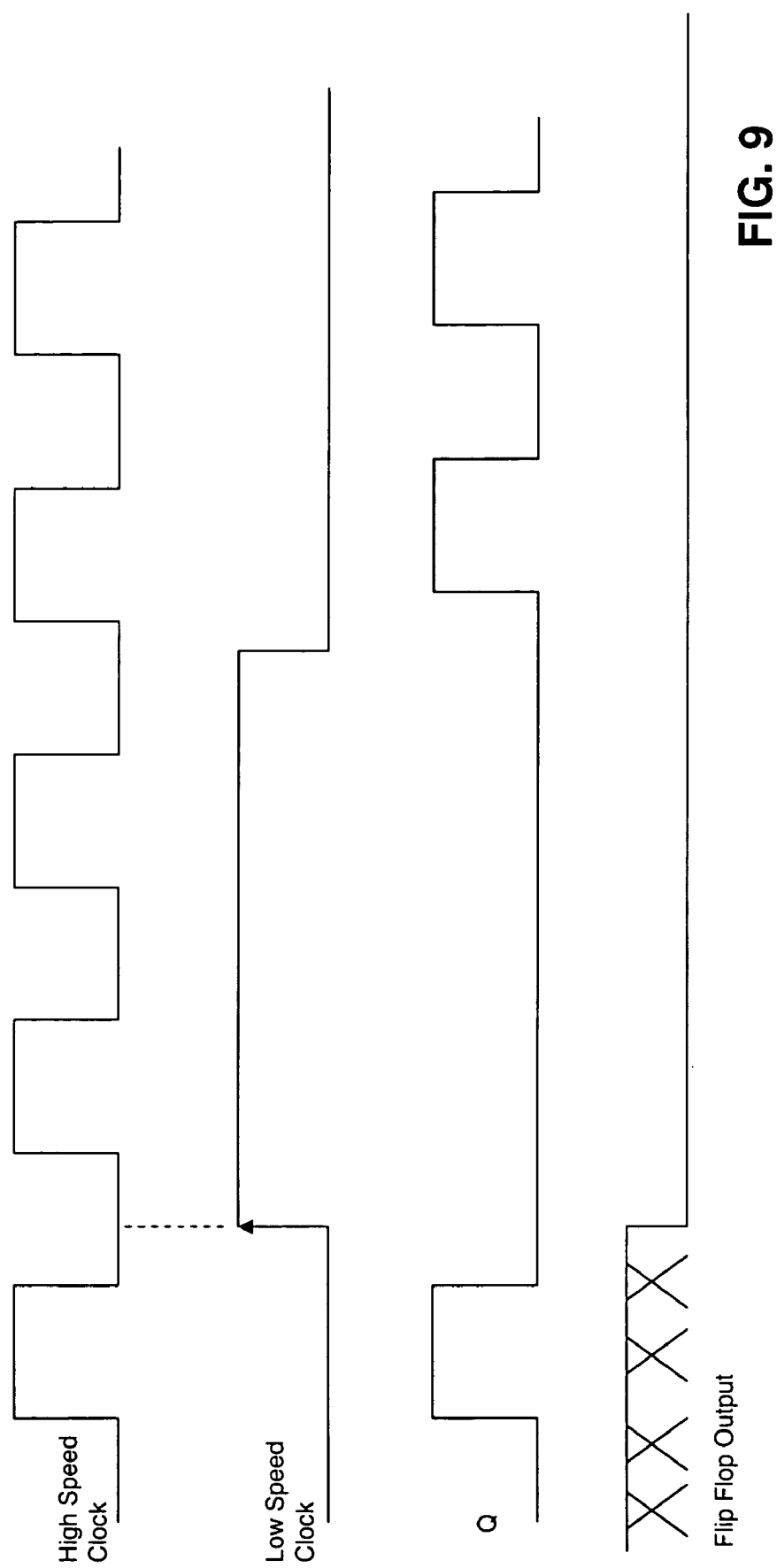
FIG. 9 is a timing diagram demonstrating an example of the operation of the flip flop of FIG. 8 in accordance with an exemplary embodiment of the present invention.

FIG. 9 is a simplified timing diagram graphically illustrating an example of the operation of the flip flop of FIG. 8. As illustrated in the timing diagram, when the low speed clock is low and leads the high speed clock the first differential pair 730 is on and the latch 710 outputs a high speed differential clock signal (Q). That is, when the low speed clock is low the output (Q) follows (i.e., tracks) the state of the high speed clock.

In this instance a first differential pair 750 of the second latch 720 is off and a second differential pair 760 is on. As a result, the second latch 720 holds (i.e., maintains) its previous state.

When the low speed clock signal goes high the differential pair 730 turns off and a second differential pair 740 of the first latch turns on thereby holding (i.e., maintaining) the previous state of the high speed clock signal. As a result, the output (Q) of the first latch 710 remains low.

In this instance the first differential pair 750 of the second latch 720 turns on and the second differential pair 760 turns off. This causes the output of the flip flop to go low.

When the low speed clock goes low again the output (Q) of the first latch 710 again follows the high speed clock signal. However, the output of the flip flop remains low until the low speed clock no longer leads the high speed clock.

As discussed above, when the phase detector generates a phase error signal that indicates that the low speed clock leads the high speed clock, the delay lock loop will impart additional delay on the low speed clock. This will continue until the low speed clock eventually lags the high speed clock. When this happens, the output of the flip flop will go high which will cause the delay lock loop to reduce the delay. By continually adjusting the delay in this manner, the delay lock loop may effectively align the transition edges of the high speed clock and the low speed clock.

It should be appreciated that the timing diagrams depicted above are simplified and do not depict all delays that exist in a typical system. For example, the D-to-Q delay of the flip flops is not shown in the timing diagram. In addition, additional delays may be imparted in the timing by, for example, buffers that may be used to provide sufficient drive for the clock signals. For example, a pair of serially connected inverting buffers may be inserted into the low speed clock connection between the high speed flip flop and the low speed flip flop to provide more clock drive. Also, in one embodiment an additional inverter may be inserted into this low speed clock connection to provide a differential low speed clock signal. In some CML embodiments these inverters will impart delays on the order of 50 pS.

Figure 10:
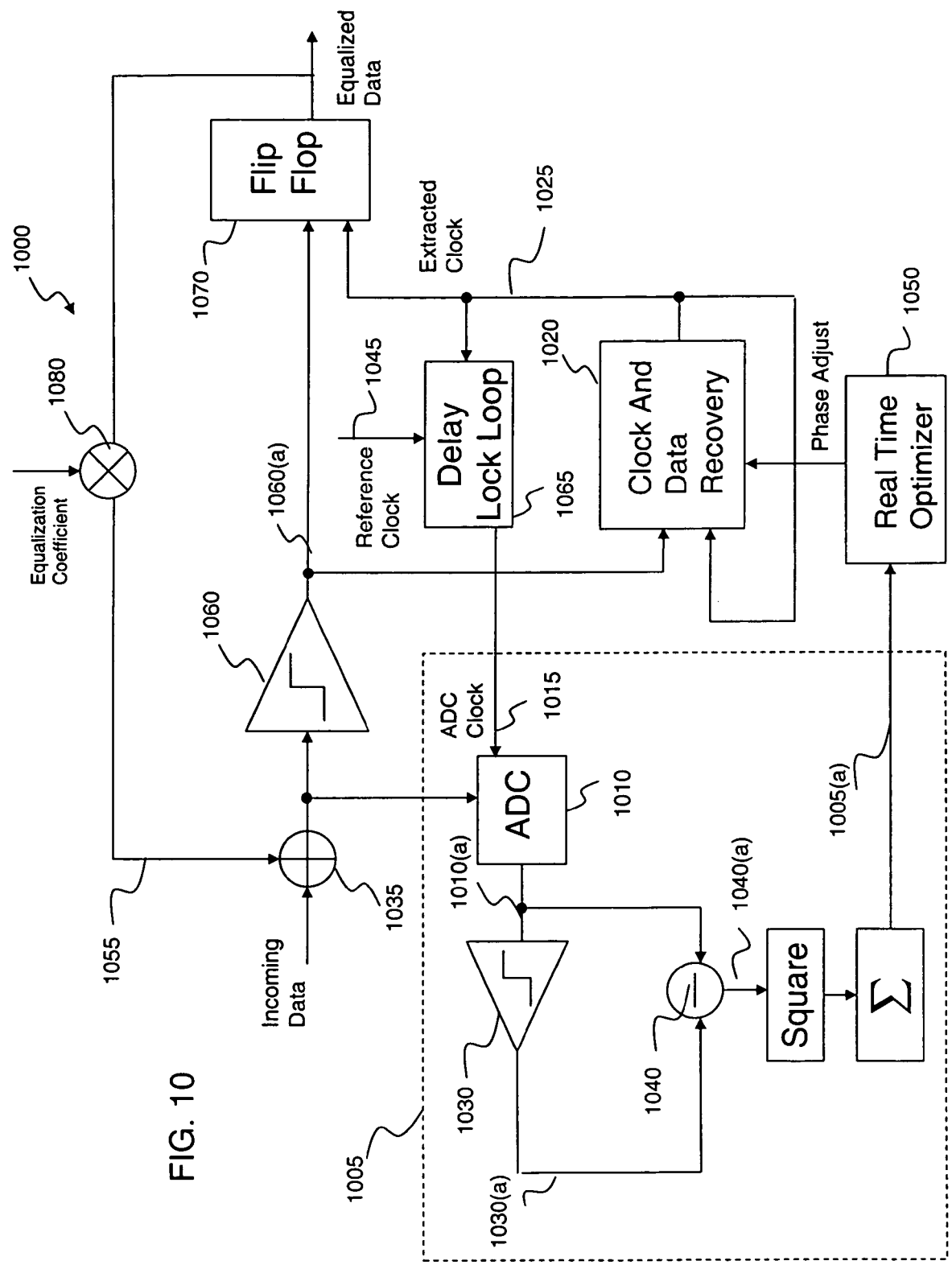
FIG. 10 is a simplified block diagram of a portion of a receiver including a decision feedback equalizer, a clock and data recovery circuit and a delay lock loop in accordance with an exemplary embodiment of the present invention.

FIG. 10 depicts a portion of one embodiment of a high speed receiver 1000 that may incorporate a phase detector constructed according to the teachings herein. The receiver 1000 includes a decision feedback equalizer adapted to reduce channel related distortion in received data and a clock and data recovery circuit 1020. The decision feedback equalizer includes a summer 1035, a slicer 1060, a retimer (e.g. a flip flop) 1070 and a multiplier 1080.

The clock and data recovery circuit 1020 is coupled to the equalizer to generate an extracted clock signal 1025 from equalized data 1060(a). The retimer 1070 of the decision feedback equalizer then generates recovered equalized data from the equalized data 1060(a) in response to the extracted clock signal 1025.

The high speed receiver 1000 includes a monitor circuit 1005 that tracks the distortion in soft decision data output by the summer 1035 of the decision feedback equalizer. The monitor circuit 1005 generates a distortion error signal 1005(a) from the soft decision data that may be used by a real time optimizer 1050 to adjust the phase offset signal of the clock and data recovery circuit 1020 to improve the performance of the receiver 1000.

The monitor circuit 1005 may include an analog to digital converter (ADC) 1010 that converts the analog soft decision signal output by the summer 1035 to a digital signal 1010(a). In one embodiment the analog to digital converter samples the analog soft decision at a relatively low rate in response to a low speed ADC clock. The ADC clock 1015 may be, for example, a low-frequency signal generated by a stable oscillation source (e.g., a crystal).

In one embodiment a delay lock loop 1065 as described herein may be used to align the transition edges of a low frequency reference clock 1045 with the transition edges of the extracted clock signal 1025 to generate the ADC clock 1015. In this way, the monitor circuit 1005 may be synchronized with the decision feedback equalizer.

A digital limiter 1030 and a combiner 1040 cooperate to generate an error signal 1040(a) from the digitized signal 1010(a). The error signal 1040(a) may then be squared and then accumulated to generate a sum square error signal 1005(a) that is sent to the real time optimizer 1050.

Figure 11:
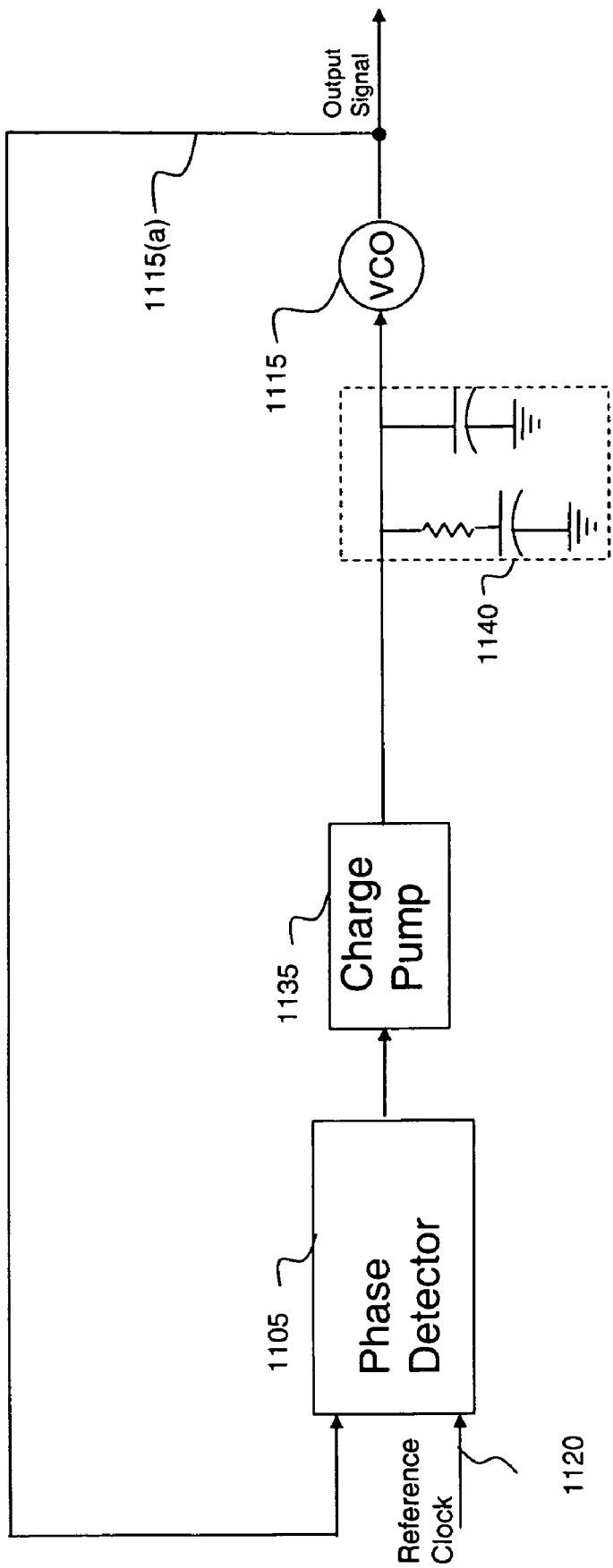
FIG. 11 is a simplified block diagram of a phase lock loop incorporating a phase detector in accordance with an exemplary embodiment of the present invention.

FIG. 11 depicts one embodiment of a phase lock loop (PLL) that may incorporate a phase detector constructed according to the teachings herein. For example, a phase detector 1105 constructed according to the embodiment of FIG. 5 may generate at least one error signal representative of the phase difference between a fixed reference clock 1120 and a feedback signal 1115(a) generated by a voltage controlled oscillator (VCO) 1115. In one embodiment the reference clock 1120 is a relatively low-frequency signal generated by a stable oscillation source (e.g., a crystal).

In contrast with some conventional phase lock loops, the feedback signal 1115(a) may not need to be divided down in frequency before it is fed back to the phase detector 1105. This is because the phase detector as discussed herein is capable of comparing the phase of signals having different frequencies.

A charge pump 1135 generates a current signal whose magnitude varies as a function of the magnitude of the output signal of the phase detector 1105. A loop filter 1140 then filters out the high frequency components of the current signal output by charge pump 1135 and forwards the filtered signal to the voltage controlled oscillator (VCO) 1115 to control the frequency of the signal 1115(a) output by the VCO 1115.

While certain exemplary embodiments have been described above in detail and shown in the accompanying drawings, it is to be understood that such embodiments are merely illustrative of and not restrictive of the broad invention. It will thus be recognized that various modifications may be made to the illustrated and other embodiments of the invention described above, without departing from the broad inventive scope thereof. In view of the above it will be understood that the invention is not limited to the particular embodiments or arrangements disclosed, but is rather intended to cover any changes, adaptations or modifications which are within the scope and spirit of the invention as defined by the appended claims.

What is claimed is:

1. A binary phase detector comprising:
    a first flip flop comprising:
        a high speed latch and a low speed latch;
        a data input coupled to a first signal having a first frequency, and
        a clock input coupled to a second signal having a second frequency and a given phase relationship with the first signal, wherein the first frequency is a multiple of the second frequency; and
a second flip flop comprising:
a data input coupled to an output of the first flip flop, and
a clock input coupled to the second signal at substantially the given phase relationship with the first signal.

2. The phase detector of claim 1, wherein the high speed latch comprises at least one inductive load.

3. The phase detector of claim 1 wherein each data input provides a lower capacitive load than each clock input so that a lower capacitive load is provided to higher frequency signals than is provided to lower frequency signals.

4. The phase detector of claim 1 wherein the first signal comprises a first clock signal and the second signal comprise a second clock signal.

5. The phase detector of claim 1 wherein an output of the second flip flop provides a binary indication of whether the first signal leads or lags the second signal.

6. The phase detector of claim 1, wherein a signal at the data input of the low speed flip flop is of a lower frequency that the first frequency such that the low speed flip flop is adapted to operate at a lower speed than the high speed flip flop.

7. The phase detector of claim 1, wherein the data input of the low speed flip flop provides a lower capacitive load than the data input of the high speed flip flop.

8. The phase detector of claim 1, wherein a data input of the low speed latch provides a lower capacitive load than a data input of the high speed latch.

9. A phase detector comprising:
a high speed flip flop comprising:
a data input coupled to a first signal having a first frequency, and
a clock input coupled to a second signal having a second frequency, wherein the first frequency is a multiple of the second frequency; and
a second flip flop comprising:
a data input coupled to an output of the high speed flip flop, and
a clock input coupled to the second signal;
wherein the high speed flip flop comprises at least one inductive load.

10. A phase detector comprising:
a first flip flop comprising:
a data input coupled to a first signal having a first frequency, and
a clock input coupled to a second signal having a second frequency, wherein the first frequency is a multiple of the second frequency; and
a second flip flop comprising:
a data input coupled to an output of the first flip flop, and
a clock input coupled to the second signal;
wherein:
the data input of the first flip flop comprises a first differential input;
the data input of the second flip flop comprises a second differential input; and
the clock inputs of the first and second flip flops comprise differential clock inputs.

11. A binary phase detector comprising:
a high speed flip flop having a data input coupled to a first clock signal at a first clock frequency and a clock input coupled to a second clock signal at a second clock frequency wherein the first clock frequency is a multiple of the second clock frequency and wherein the high speed flip flop comprises a high speed latch and a low speed latch.

12. The phase detector of claim 11 wherein the data input provides a lower capacitive load than the clock input so that a lower capacitive load is provided to the higher frequency first clock signal than is provided to the lower frequency second clock signal.

13. The phase detector of claim 11 wherein a data input of the low speed latch provides a lower capacitive load than a data input of the high speed latch.

14. A phase detector comprising:
a high speed flip flop having a data input coupled to a first clock signal at the first clock frequency and a clock input coupled to a second clock signal at a second clock frequency wherein the first clock frequency is a multiple of the second clock frequency and wherein the high speed flip flop comprises a high speed latch and a low speed latch;
wherein the high speed flip flop comprises at least one inductive load.

15. A method of detecting relative phase of plurality of signals, the method comprising:
providing a first differential signal, having a first frequency, to a data input of a first flip flop;
clocking the first flip flop using a second differential signal having a second frequency and a given phase relationship with the first signal, wherein the first frequency is a multiple of the second frequency;
providing an output of the first flip flop to a second flip flop;
clocking the second flip flop using the second signal at substantially the given phase relationship with the first signal; and
generating at least one output signal of the second flip flop indicative of a phase difference between the first signal and the second signal.

16. The method of claim 15 wherein the at least one output signal is indicative of whether the second signal leads the first signal or whether the second signal lags the first signal.

17. The method of claim 15 comprising delaying the second signal according to the at least one output signal.

18. The method of claim 15 comprising driving an inductive load for the first flip flop.

19. The method of claim 15 wherein each data input of each flip flop provides a lower capacitive load than each clock input of each flip flop so that a lower capacitive load is provided to higher frequency signals than is provided to the lower frequency signals.

20. The method of claim 15 wherein the first signal comprises a first clock signal and the second signal comprises a second clock signal.

21. The method of claim 15 wherein:
the first flip flop is a high speed flip flop;
the second flip flop is a low speed flip flop; and
the output of the high speed flip flop is of a lower frequency than the first frequency such that the low speed flip flop is adapted to operate at a lower speed than the high speed flip flop.

22. The method of claim 21 wherein a data input of the low speed flip flop provides a lower capacitive load than the data input of the high speed flip flop.

23. The method of claim 21 wherein:
the high speed flip flop comprises a high speed latch and a low speed latch; and
a data input of the low speed latch provides a lower capacitive load than a data input of the high speed latch.

24. The method of claim 15 wherein the first and second signals are provided to a binary phase detector that performs the providing, clocking and generating.

25. A delay lock loop comprising:
a binary phase detector comprising:
  a first flip flop comprising a high speed latch, a low speed latch, a data input coupled to a first signal having a first frequency, a clock input coupled to a second signal having a second frequency and a given phase relationship with the first signal, wherein the first frequency is a multiple of the second frequency, and at least one output; and
  a second flip flop comprising a data input coupled to the at least one output of the first flip flop, a clock input coupled to the second signal at substantially the given phase relationship with the first signal, and at least one output for generating at least one phase error signal;
a digital filter, coupled to receive the at least one phase error signal, that generates at least one filtered signal; and
a phase rotator, coupled to receive the at least one filtered signal and the second signal, that delays the second signal according to that at least one filtered signal.

26. A delay lock loop comprising:
a phase detector comprising:
  a first flip flop comprising a data input coupled to a first signal having a first frequency, a clock input coupled to a second signal having a second frequency, wherein the first frequency is a multiple of the second frequency, and at least one output; and
  a second flip flop comprising a data input coupled to the at least one output of the first flip flop, a clock input coupled to the second signal, and at least one output for generating at least one phase error signal;
a digital filter, coupled to receive the at least one phase error signal, that generates at least one filtered signal; and
a phase rotator, coupled to receive the at least one filtered signal and the second signal, that delays the second signal according to the at least one filtered signal;
wherein:
  the first flip flop comprises a high speed latch and a low speed latch; and
  the high speed latch comprises at least one inductive load.

27. A delay lock loop comprising:
a phase detector comprising:
  a first flip flop comprising a data input coupled to a first signal having a first frequency, a clock input coupled to a second signal having a second frequency, wherein the first frequency is a multiple of the second frequency, and at least one output; and
  a second flip flop comprising a data input coupled to the at least one output of the first flip flop, a clock input coupled to the second signal, and at least one output for generating at least one phase error signal;
a digital filter, coupled to receive the at least one phase error signal, that generates at least one filtered signal; and
a phase rotator, coupled to receive the at least one filtered signal and the second signal, that delays the second signal according to the at least one filtered signal;
wherein:
  the data input of the first flip flop comprises a first differential input;
  the data input of the second flip flop comprises a second differential input; and
  the clock inputs of the first and second flip flops comprise differential clock inputs.

28. A phase lock loop comprising:
a binary phase detector comprising:
  a first flip flop comprising a high speed latch, a low speed latch, a data input coupled to a first signal having a first frequency, a clock input coupled to a second signal having a second frequency and a given phase relationship with the first signal, wherein the first frequency is a multiple of the second frequency, and at least one output; and
  a second flip flop comprising a data input coupled to the at least one output of the first flip flop, a clock input coupled to the second signal at substantially the given phase relationship with the first signal, and at least one output for generating at least one phase error signal;
a charge pump, coupled to receive the at least one phase error signal, that generates at least one current signal;
a loop filter, coupled to receive the at least one current signal, that generates at least one filtered signal; and
a delay circuit, coupled to receive the at least one filtered signal and the second signal, that delays the second signal according to the at least one filtered signal.

29. The phase lock loop of claim 28 wherein the delay circuit comprises at least one delay line.

30. A phase lock loop comprising:
a phase detector comprising:
  a first flip flop comprising a data input coupled to a first signal having a first frequency, a clock input coupled to a second signal having a second frequency, wherein the first frequency is a multiple of the second frequency, and at least one output; and
  a second flip flop comprising a data input coupled to the at least one output of the first flip flop, a clock input coupled to the second signal, and at least one output for generating at least one phase error signal;
a charge pump, coupled to receive the at least one phase error signal, that generates at least one current signal;
a loop filter, coupled to receive the at least one current signal, that generates at least one filtered signal; and
a delay circuit, coupled to receive the at least one filtered signal and the second signal, that delays the second signal according to the at least one filtered signal;
wherein:
  the first flip flop comprises a high speed latch and a low speed latch; and
  the high speed latch comprises at least one inductive load.

31. A phase lock loop comprising:
a phase detector comprising:
  a first flip flop comprising a data input coupled to a first signal having a first frequency, a clock input coupled to a second signal having a second frequency, wherein the first frequency is a multiple of the second frequency, and at least one output; and
  a second flip flop comprising a data input coupled to the at least one output of the first flip flop, a clock input coupled to the second signal, and at least one output for generating at least one phase error signal;
a charge pump, coupled to receive the at least one phase error signal, that generates at least one current signal;
a loop filter, coupled to receive the at least one current signal, that generates at least one filtered signal; and
a delay circuit, coupled to receive the at least one filtered signal and the second signal, that delays the second signal according to the at least one filtered signal;
wherein:
  the data input of the first flip flop comprises a first differential input;
  the data input of the second flip flop comprises a second differential input; and
  the clock inputs of the first and second flip flops comprise differential clock inputs.

* * * * *